United States Patent
Fang et al.

(10) Patent No.: US 11,545,425 B2
(45) Date of Patent: Jan. 3, 2023

(54) SUBSTRATE COMPRISING INTERCONNECTS EMBEDDED IN A SOLDER RESIST LAYER

(71) Applicant: QUALCOMM Incorporated, San Diego, CA (US)

(72) Inventors: Kun Fang, San Diego, CA (US); Jaehyun Yeon, San Diego, CA (US); Suhyung Hwang, Rancho Mission Viejo, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/066,318

(22) Filed: Oct. 8, 2020

(65) Prior Publication Data
US 2022/0115312 A1 Apr. 14, 2022

(51) Int. Cl.
*H01L 23/498* (2006.01)
*H01L 23/00* (2006.01)
*H01L 21/48* (2006.01)

(52) U.S. Cl.
CPC .... *H01L 23/49838* (2013.01); *H01L 21/4853* (2013.01); *H01L 21/4857* (2013.01); *H01L 23/49822* (2013.01); *H01L 24/16* (2013.01); *H01L 2224/16227* (2013.01)

(58) Field of Classification Search
CPC ......... H01L 23/49838; H01L 23/49822; H01L 24/16
See application file for complete search history.

(56) References Cited

U.S. PATENT DOCUMENTS

| 2006/0244128 A1* | 11/2006 | Hayashi | H01L 23/36 257/E23.101 |
|---|---|---|---|
| 2011/0147057 A1 | 6/2011 | Takada et al. | |
| 2011/0316170 A1 | 12/2011 | Muramatsu et al. | |
| 2012/0073862 A1* | 3/2012 | Muramatsu | H05K 1/0269 174/250 |
| 2017/0263545 A1* | 9/2017 | Tsukamoto | H01L 23/49822 |
| 2020/0066613 A1* | 2/2020 | Lee | H01L 21/4853 |

FOREIGN PATENT DOCUMENTS

| EP | 2632237 A1 | 8/2013 |
|---|---|---|
| JP | 2011119567 A | 6/2011 |

OTHER PUBLICATIONS

International Search Report and Written Opinion—PCT/US2021/051479—ISA/EPO—dated Jan. 18, 2022.

* cited by examiner

*Primary Examiner* — Michael Jung
(74) *Attorney, Agent, or Firm* — Loza & Loza, LLP

(57) ABSTRACT

A substrate that includes a core layer, at least one first dielectric layer located over a first surface of the core layer, at least one second dielectric layer located over a second surface of the core layer, a plurality of first interconnects located over a surface of the at least one first dielectric layer, a plurality of second interconnects located over the surface of the at least one first dielectric layer, a plurality of third interconnects located over the surface of the at least one first dielectric layer, and a solder resist layer located over the surface of the at least one second dielectric layer. The plurality of third interconnects and the plurality of second interconnects are co-planar to the plurality of first interconnects. The solder resist layer includes a first portion, a second portion, and a third portion.

24 Claims, 14 Drawing Sheets

PROFILE VIEW

PROFILE VIEW

TOP PLAN VIEW

PROFILE VIEW

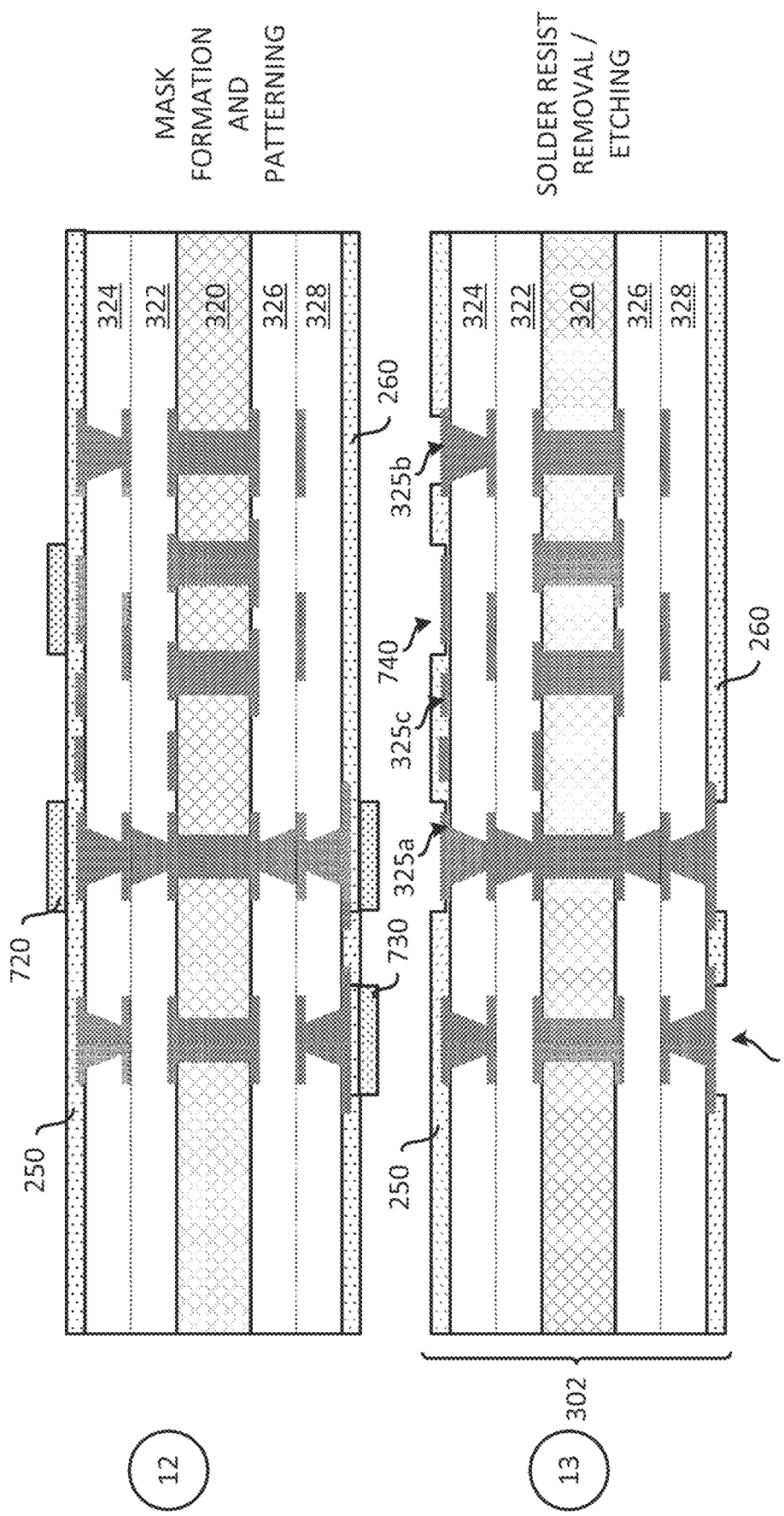

SUBSTRATE COMPRISING INTERCONNECTS EMBEDDED IN A SOLDER RESIST LAYER

FIELD

Various features relate to substrates, and more specifically to a substrate that includes a high-density interconnects.

BACKGROUND

FIG. 1 illustrates a package 100 that includes a substrate 102, an integrated device 104 and an integrated device 106. The substrate 102 includes at least one dielectric layer 120, a plurality of interconnects 122 and a plurality of solder interconnects 124. A plurality of solder interconnects 144 is coupled to the substrate 102 and the integrated device 104. A plurality of solder interconnects 164 is coupled to the substrate 102 and the integrated device 106. Fabricating a substrate that includes high-density interconnects can be expensive. There is an ongoing need to provide a low-cost substrate that includes high-density interconnects.

SUMMARY

Various features relate to substrates, and more specifically to a substrate that includes a high-density interconnects.

One example provides a substrate that includes a core layer, at least one first dielectric layer located over a first surface of the core layer, at least one second dielectric layer located over a second surface of the core layer, a plurality of first interconnects located over a surface of the at least one first dielectric layer, a plurality of second interconnects located over the surface of the at least one first dielectric layer, a plurality of third interconnects located over the surface of the at least one first dielectric layer, and a solder resist layer located over the surface of the at least one second dielectric layer. The plurality of third interconnects and the plurality of second interconnects are co-planar to the plurality of first interconnects. The solder resist layer includes a first portion, a second portion, and a third portion. The first portion of the solder resist layer that is touching the plurality of first interconnects includes a first thickness that is less than a thickness of the plurality of first interconnects. The second portion of the solder resist layer that is touching the plurality of second interconnects includes a second thickness that is greater than a thickness of the plurality of second interconnects. The third portion of the solder resist layer is located over a top surface and a side surface of the plurality of third interconnects.

Another example provides an apparatus that includes an integrated device and a substrate coupled to the integrated device. The substrate includes a core layer, at least one first dielectric layer located over a first surface of the core layer, at least one second dielectric layer located over a second surface of the core layer, means for first interconnection located over a surface of the at least one first dielectric layer, means for second interconnection located over the surface of the at least one first dielectric layer, means for third interconnection located over the surface of the at least one first dielectric layer, and a solder resist layer located over the surface of the at least one second dielectric layer. The means for third interconnection and the means for second interconnection are co-planar to the means for first interconnection. The solder resist layer includes a first portion, a second portion, and a third portion. The first portion of the solder resist layer that is touching the means for first interconnection includes a first thickness that is less than a thickness of the means for first interconnection. The second portion of the solder resist layer that is touching the means for second interconnection includes a second thickness that is greater than a thickness of the means for second interconnection. The third portion of the solder resist layer is located over a top surface and a side surface of the means for third interconnection.

Another example provides a method for fabricating a substrate. The method provides a core layer comprising a first surface and a second surface. The method forms at least one first dielectric layer over a first surface of the core layer. The method forms at least one second dielectric layer over a second surface of the core layer. The method forms a plurality of first interconnects over a surface of the at least one first dielectric layer. The method forms a plurality of second interconnects over the surface of the at least one first dielectric layer. The plurality of second interconnects and the plurality of first interconnects are located on a same metal layer. The method forms a plurality of third interconnects over the surface of the at least one first dielectric layer. The plurality of third interconnects, the plurality of second interconnects and the plurality of first interconnects are located on the same metal layer. The method forms a solder resist layer located over the surface of the at least one first dielectric layer. The method removes portions of the solder resist layer. A first portion of the solder resist layer that is touching the plurality of first interconnects includes a first thickness that is less than a thickness of the plurality of first interconnects. A second portion of the solder resist layer that is touching the plurality of second interconnects includes a second thickness that is greater than a thickness of the plurality of second interconnects. A third portion of the solder resist layer is located over a top surface and a side surface of the plurality of third interconnects.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 7A-7E illustrate an exemplary sequence for fabricating a substrate that includes a high-density interconnect embedded in a solder resist layer.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a substrate that includes a core layer, at least one first dielectric layer (e.g., first prepreg layer) located over a first surface of the core layer, at least one second dielectric layer (e.g., second prepreg layer) located over a second surface of the core layer, a plurality of first interconnects (e.g., high-density pad interconnects) located over a surface of the at least one first dielectric layer, a plurality of second interconnects located over the surface of the at least one first dielectric layer, a plurality of third interconnects (e.g., high-density trace interconnects) located over the surface of the at least one first dielectric layer, and a solder resist layer located over the surface of the at least one second dielectric layer. The plurality of third interconnects is coupled to the plurality of first interconnects. The plurality of third interconnects and the plurality of second interconnects are co-planar to the plurality of first interconnects. The solder resist layer includes a first portion, a second portion, and a third portion. The first portion of the solder resist layer that is touching the plurality of first interconnects includes a first thickness that is less than a thickness of the plurality of first interconnects. The second portion of the solder resist layer that is touching the plurality of second interconnects includes a second thickness that is greater than a thickness of the plurality of second interconnects. The third portion of the solder resist layer is located over a top surface and a side surface of the plurality of third interconnects. An integrated device may be coupled to the plurality of high-density interconnects and the plurality of interconnects of the substrate through a plurality of pillar interconnects and/or a plurality of solder interconnects. As will be further described below, the substrate provides a low-cost high reliability substrate with a low short risk in an escape portion of the substrate. In addition, a shorter fabrication process for the substrate is provided which may reduce the cost of the substrate.

Figure 1:
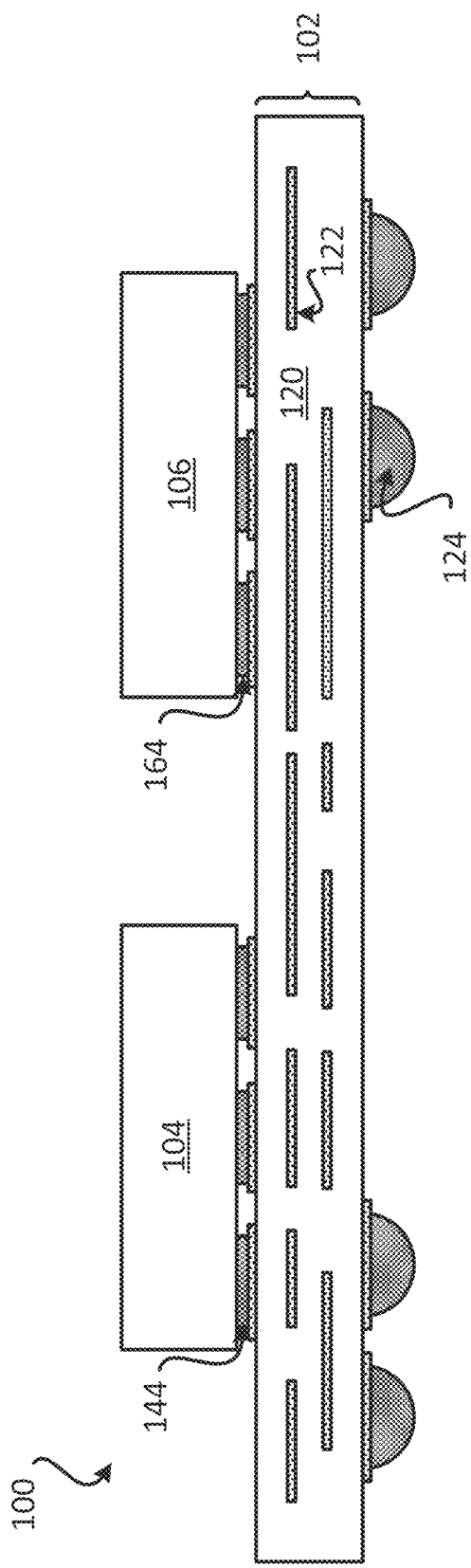
FIG. 1 illustrates a profile view of a package that includes a substrate and integrated devices coupled to a substrate.
Figure 2:
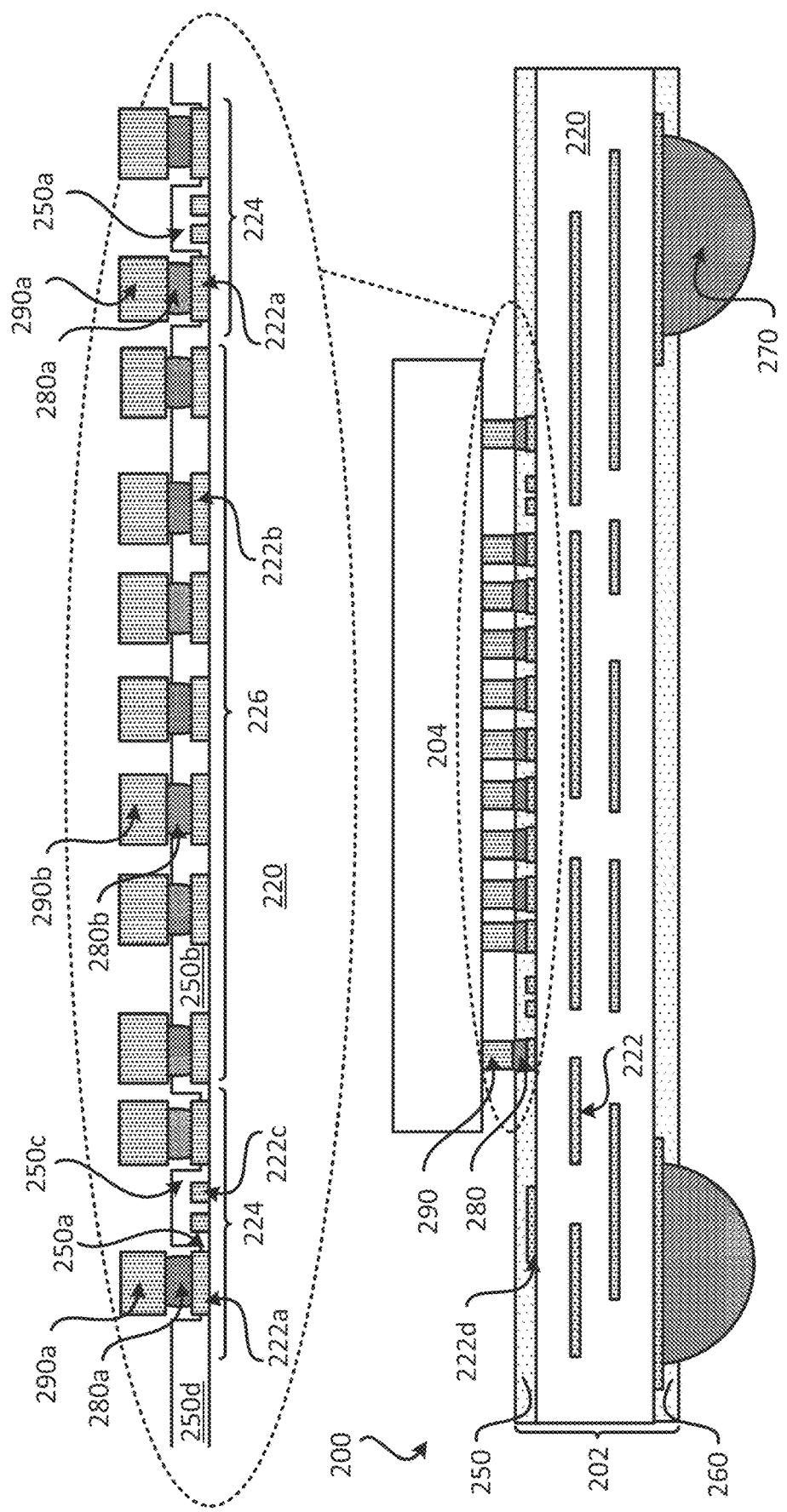
FIG. 2 illustrates a profile view of a package that includes a substrate and an integrated device coupled to high-density interconnects and interconnects that are embedded in a solder resist layer of the substrate.

Exemplary Packages that Include a Substrate Comprising High-Density Interconnects Embedded in a Solder Resist Layer FIG. 2 illustrates a profile view of a package 200 that includes an integrated device and a substrate comprising high-density interconnects embedded in a solder resist layer. The package 200 includes a substrate 202, an integrated device 204. The integrated device 204 is coupled to a first surface (e.g., top surface) of the substrate 202 through a plurality of pillar interconnects 290 and/or a plurality of solder interconnects 280. The plurality of pillar interconnects 290 includes plurality of pillar interconnect 290*a* and a plurality of pillar interconnect 290*b*. The plurality of solder interconnects 280 includes a plurality of solder interconnects 280*a* and a plurality of solder interconnects 280*b*.

As shown in FIG. 2, the substrate 202 includes at least one dielectric layer 220, a plurality of interconnects 222, a solder resist layer 250 and a solder resist layer 260. The solder resist layer 250 may be located on the first surface (e.g., top surface) of the substrate 202. The solder resist layer 260 may be located on second surface (e.g., bottom surface) of the substrate 202. Some of the plurality of interconnects 222 may be located in the at least one dielectric layer 220. Some of the plurality of interconnects 222 may be located over one or more surfaces of the at least one dielectric layer 220. The plurality of interconnects 222 may include a plurality of high-density interconnects 222*a* (e.g., plurality of first interconnects), a plurality of interconnects 222*b* (e.g., plurality of second interconnects), a plurality of high-density interconnects 222*c*, and a plurality of interconnects 222*d*. Some interconnects from the plurality of interconnects 222 may be embedded in the solder resist layer 250 and/or the solder resist layer 260. The plurality of high-density interconnects 222*a*, the plurality of interconnects 222*b* and the plurality of high-density interconnects 222*c* may be co-planar to each other. For example, the plurality of high-density interconnects 222*a* and the plurality of high-density interconnects 222*c* may be located on the same metal layer of the substrate 202 as the plurality of interconnects 222*b*. The plurality of high-density interconnects 222*a*, the plurality of high-density interconnects 222*c* and the plurality of interconnects 222*b* are embedded in the solder resist layer 250. The substrate 202 may include an escape portion 224 (e.g., integrated escape portion) and a non-escape portion 226. The plurality of high-density interconnects 222*a* (e.g., high-density pad interconnects) and the plurality of high-density interconnects 222*c* (e.g., high-density trace interconnects) may be located in the escape portion 224 of the substrate 202. The plurality of high-density interconnects 222*a* may be coupled to the plurality of high-density interconnects 222*c*. The plurality of high-density interconnects 222*a* may be configured to be electrically coupled to the plurality of high-density interconnects 222*c*. An escape portion 224 of the substrate 202 is a portion of the substrate 202 that includes interconnects (e.g., pad interconnects) that are configured to be electrically coupled to solder interconnects of an integrated device. Escape portions are further illustrated and described below in at least FIGS. 4 and 5. The plurality of high-density interconnects 222*a* may be partially embedded in the solder resist layer 250. The plurality of high-density interconnects 222*c* may be completely embedded in the solder resist layer 250. The solder resist layer 250 may have different portions with different thicknesses. The solder resist layer 250 may include a solder resist layer portion 250*a* (e.g., first portion), a solder resist layer portion 250*b* (e.g., second portion), a solder resist layer portion 250*c* (e.g., third portion) and a solder resist layer portion 250*d*. The solder resist layer portion 250*a* may partially embed the plurality of high-density interconnects 222*a*. However, a top surface of the plurality of high-density interconnects 222*a* may be free of a solder resist layer. In some implementations, a portion of a side surface of the plurality of high-density interconnects 222*a* may be covered by a solder resist layer. In some implementations, the plurality of high-density interconnects 222*a* may not be directly touching a solder resist layer. In such instances, the solder resist layer portion 250*a* may not be present and the solder resist layer portion 250*a* may be considered to have a thickness of zero. The solder resist layer portion 250*b* may partially embed the plurality of interconnects 222*b*. A portion of a top surface of the plurality of interconnects 222*b* may be free of a solder resist layer and another portion of the top surface of the plurality of interconnects 222*b* may be covered by a solder resist layer (e.g., solder resist layer portion 250*b*). The solder resist layer portion 250*c* may completely embed the plurality of interconnects 222*c*. For example, a top surface and a side surface of the plurality of high-density interconnects 222*c* may be covered by a solder resist layer (e.g., solder resist layer portion 250*c*). The thickness of the solder resist layer portion 250*a* may be less than the thickness of the solder resist layer portion 250*b*, the thickness of the solder resist layer portion 250*c* and the thickness of the solder resist layer portion 250*d*.

In some implementations, the plurality of high-density interconnects 222*a* and the plurality of high-density interconnects 222*c* may have a lower minimum width and/or minimum spacing than the minimum width and/or minimum spacing of the plurality of interconnects 222*b* and/or the plurality of interconnects 222*d*. For example, the plurality of high-density interconnects 222*a* and the plurality of high-density interconnects 222*c* may include interconnects with (i) a minimum width of 8 micrometers and (ii) a minimum spacing of 10 micrometers, and the plurality of interconnects 222*b* and the plurality of interconnects 222*d* may include interconnects with (i) a minimum width of 20 micrometers and (ii) a minimum spacing of 25 micrometers. An interconnect that is not a high-density interconnect may be a low-density interconnect that has lower minimum width and/or minimum spacing than the minimum width and/or minimum spacing of a high-density interconnect.

As mentioned above, the integrated device 204 is coupled to a first surface (e.g., top surface) of the substrate 202 through the plurality of pillar interconnects 290 and/or the plurality of solder interconnects 280. The plurality of pillar interconnects 290*a* is coupled to the plurality of solder interconnects 280*a*. The plurality of solder interconnects 280*a* is coupled to the plurality of high-density interconnects 222*a*. The plurality of pillar interconnects 290*b* is coupled to the plurality of solder interconnects 280*b*. The plurality of solder interconnects 280*b* is coupled to the plurality of interconnects 222*b*.

The plurality of high-density interconnects 222*a* and/or the plurality of high-density interconnects 222*c* may be examples of means for high-density interconnection. The plurality of interconnects 222*b* and/or the plurality of interconnects 222*d* may be examples of means for interconnection.

Figure 3:
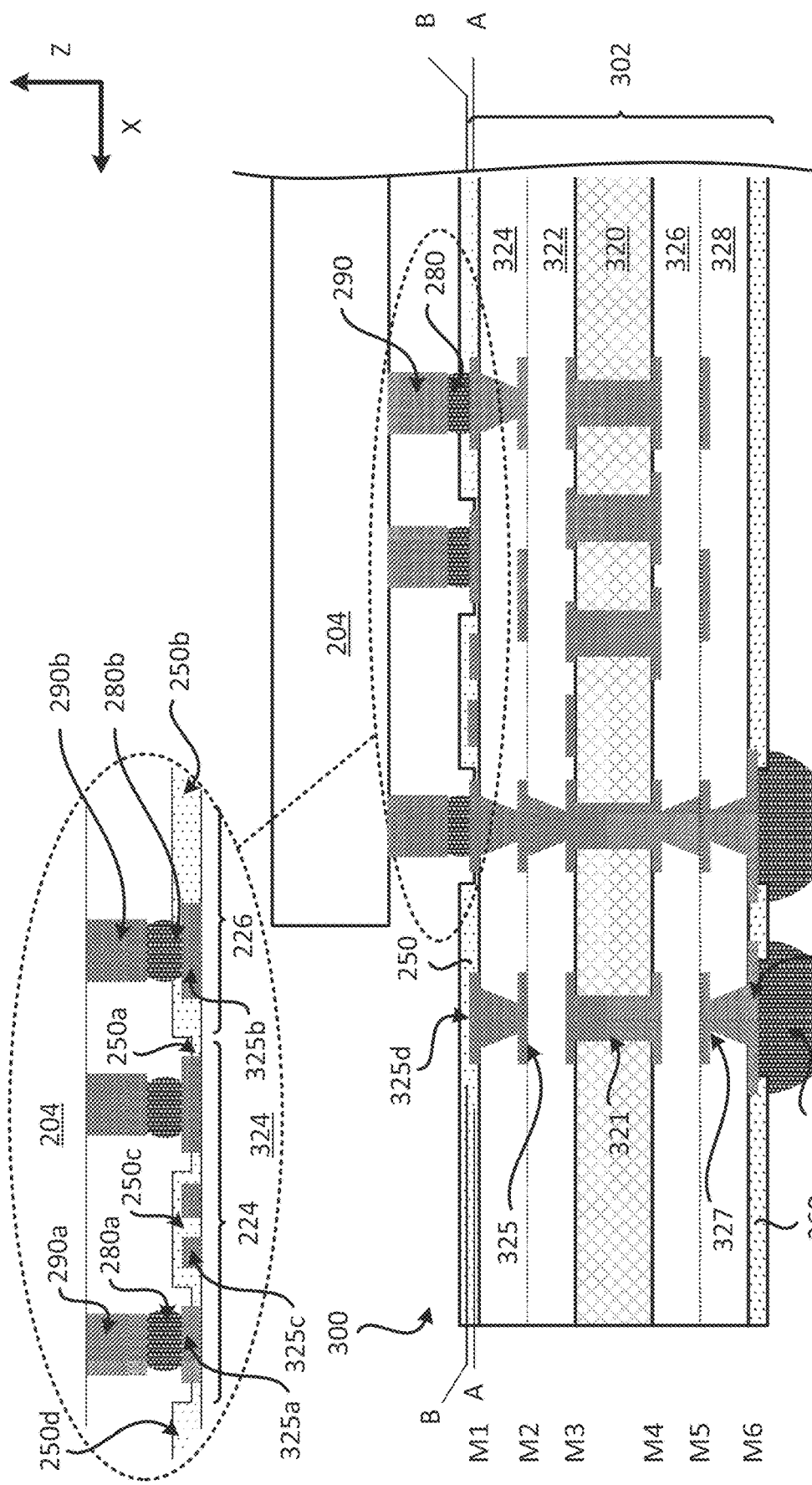
FIG. 3 illustrates a profile view of a package that includes a substrate and an integrated device coupled to high-density interconnects and interconnects that are embedded in a solder resist layer of the substrate.

FIG. 3 illustrates a package 300 that includes a substrate 302 and the integrated device 204. The package 300 may be similar to the package 200, and thus may include similar components and/or be arranged in a similar manner as described for the package 200. The substrate 302 may be similar to the substrate 202, and thus may include similar components and/or be arranged in a similar manner as described for the substrate 202. The integrated device 204 is coupled to a first surface (e.g., top surface) of the substrate 302 through the plurality of pillar interconnects 290 and/or the plurality of solder interconnects 280.

The substrate 302 may be a laminated substrate that includes a core layer. The substrate 302 includes a core layer 320, at least one first dielectric layer (e.g., 322, 324), at least one second dielectric layer (e.g., 326, 328), the solder resist layer 250, the solder resist layer 260, a plurality of core interconnects 321, a plurality of interconnects 325 and a plurality of interconnects 327. The plurality of solder interconnects 280 may be coupled to the substrate 302 through the plurality of interconnects 325.

The core layer 320 may include glass or glass fiber with resin. However, the core layer 320 may include different materials. The dielectric layers 322, 324, 326 and/or 328 may each include prepreg (e.g., a prepreg layer). The dielectric layers 322, 324, 326 and/or 328 may be build up layers. The dielectric layers 322, 324, 326 and/or 328 may include a different material than the core layer 320. As will be further described below, different implementations may have different numbers of dielectric layers and/or different numbers of metal layers. FIG. 3 illustrates a substrate that includes 6 metal layers (e.g., M1, M2, M3, M4, M4, M5, M6). However, a substrate may include more or less metal layers and/or more or less dielectric layers. For example, a substrate may include 10 metal layers.

Some of the interconnects from the plurality of interconnects 325 may be located in the dielectric layers 322 and/or 324. Some of the interconnects from the plurality of interconnects 325 may be located over a surface of the dielectric layer 324. The plurality of interconnects 325 includes a plurality of high-density interconnects 325*a* (e.g., plurality of first interconnects, plurality of pad interconnects), a plurality of interconnects 325*b* (e.g., plurality of second interconnects), a plurality of high-density interconnects 325*c* (e.g., plurality of third interconnects, plurality of high-density trace interconnects), and a plurality of interconnects 325*d*. The core layer 320 includes a first surface and a second surface. The at least one first dielectric layer (e.g., 322, 324) is located over the first surface of the core layer 320. The at least one second dielectric layer (e.g., 326, 328) is located over the second surface of the core layer 320. The plurality of high-density interconnects 325*a* and the plurality of high-density interconnects 325*c* are located over a surface of the at least one first dielectric layer 324. The plurality of interconnects 325*b* and the plurality of interconnects 325*d* are located over the surface of the at least one first dielectric layer 324. The solder resist layer 250 is located over the surface of the at least one first dielectric layer 324. The plurality of high-density interconnects 325*a*, the plurality of interconnects 325*b*, the plurality of high-density interconnects 325*c*, and the plurality of interconnects 325*d* are co-planar to each other. The plurality of high-density interconnects 325*a*, the plurality of interconnects 325*b*, the plurality of high-density interconnects 325*c*, and the plurality of interconnects 325*d* may be located on the same metal layer (e.g., M1) of the substrate 302. The solder resist layer 250 includes a first thickness and a second thickness.

The substrate 302 may include an escape portion 224 (e.g., integrated escape portion) and a non-escape portion 226. The plurality of high-density interconnects 325*a* (e.g., pad interconnects) and the plurality of high-density interconnects 325*c* (e.g., trace interconnects) may be located in the escape portion 224 of the substrate 302. An escape portion 224 of the substrate 302 is a portion of the substrate 302 that includes interconnects (e.g., pad interconnects) that are configured to be electrically coupled to solder interconnects of an integrated device. The plurality of high-density interconnects 325*a* may be coupled to the plurality of high-density interconnects 325*c*. The plurality of high-density interconnects 325*a* (e.g., high-density pad interconnects) may be configured to be electrically coupled to the plurality of high-density interconnects 325*c* (e.g., high-density trace interconnects).

The solder resist layer portion 250a and the solder resist layer portion 250c may be located in the escape portion 224 of the substrate 302. The solder resist layer portion 250a may partially embed the plurality of high-density interconnects 325a. However, a top surface of the plurality of high-density interconnects 325a may be free of a solder resist layer. In some implementations, a portion of a side surface of the plurality of high-density interconnects 325a may be covered by a solder resist layer. In some implementations, the plurality of high-density interconnects 325a may be free of direct touching with a solder resist layer. In such instances, the solder resist layer portion 250a may not exist, and the solder resist layer portion 250a may be considered to have a thickness of zero. The solder resist layer portion 250b may partially embed the plurality of interconnects 325b. A portion of a top surface of the plurality of interconnects 325b may be free of a solder resist layer and another portion of the top surface of the plurality of interconnects 325b may be covered by a solder resist layer (e.g., solder resist layer portion 250b). The solder resist layer portion 250c may completely embed the plurality of interconnects 325c. A top surface and a side surface of the plurality of high-density interconnects 325c may be covered by a solder resist layer (e.g., solder resist layer portion 250c). The thickness of the solder resist layer portion 250a may be less than the thickness of the solder resist layer portion 250b, the thickness of the solder resist layer portion 250c and/or the thickness of the solder resist layer portion 250d.

In some implementations, the plurality of high-density interconnects 325a and the plurality of high-density interconnects 325c may have a lower minimum width and/or minimum spacing than the minimum width and/or minimum spacing of the plurality of interconnects 325b and/or the plurality of interconnects 325d. For example, the plurality of high-density interconnects 325a and the plurality of high-density interconnects 325c may include interconnects with (i) a minimum width of 8 micrometers and (ii) a minimum spacing of 10 micrometers, and the plurality of interconnects 325b and the plurality of interconnects 325d may include interconnects with (i) a minimum width of 20 micrometers and (ii) a minimum spacing of 25 micrometers. An interconnect that is not a high-density interconnect may be a low-density interconnect that has lower minimum width and/or minimum spacing than the minimum width and/or minimum spacing of a high-density interconnect.

As mentioned above, the integrated device 204 is coupled to a first surface (e.g., top surface) of the substrate 202 through the plurality of pillar interconnects 290 and/or the plurality of solder interconnects 280. The plurality of pillar interconnects 290a is coupled to the plurality of solder interconnects 280a. The plurality of solder interconnects 280a is coupled to the plurality of high-density interconnects 325a. The plurality of pillar interconnects 290b is coupled to the plurality of solder interconnects 280b. The plurality of solder interconnects 280b is coupled to the plurality of interconnects 325b. The plurality of solder interconnects 270 is coupled to the plurality of interconnects 327d.

The plurality of high-density interconnects 325a and/or the plurality of high-density interconnects 325c may be examples of means for high-density interconnection. The plurality of interconnects 325b and/or the plurality of interconnects 325d may be examples of means for interconnection. The plurality of solder interconnects 280 may be examples of means for solder interconnection. The plurality of pillar interconnects 290 may be examples of means for pillar interconnection.

Figure 4:
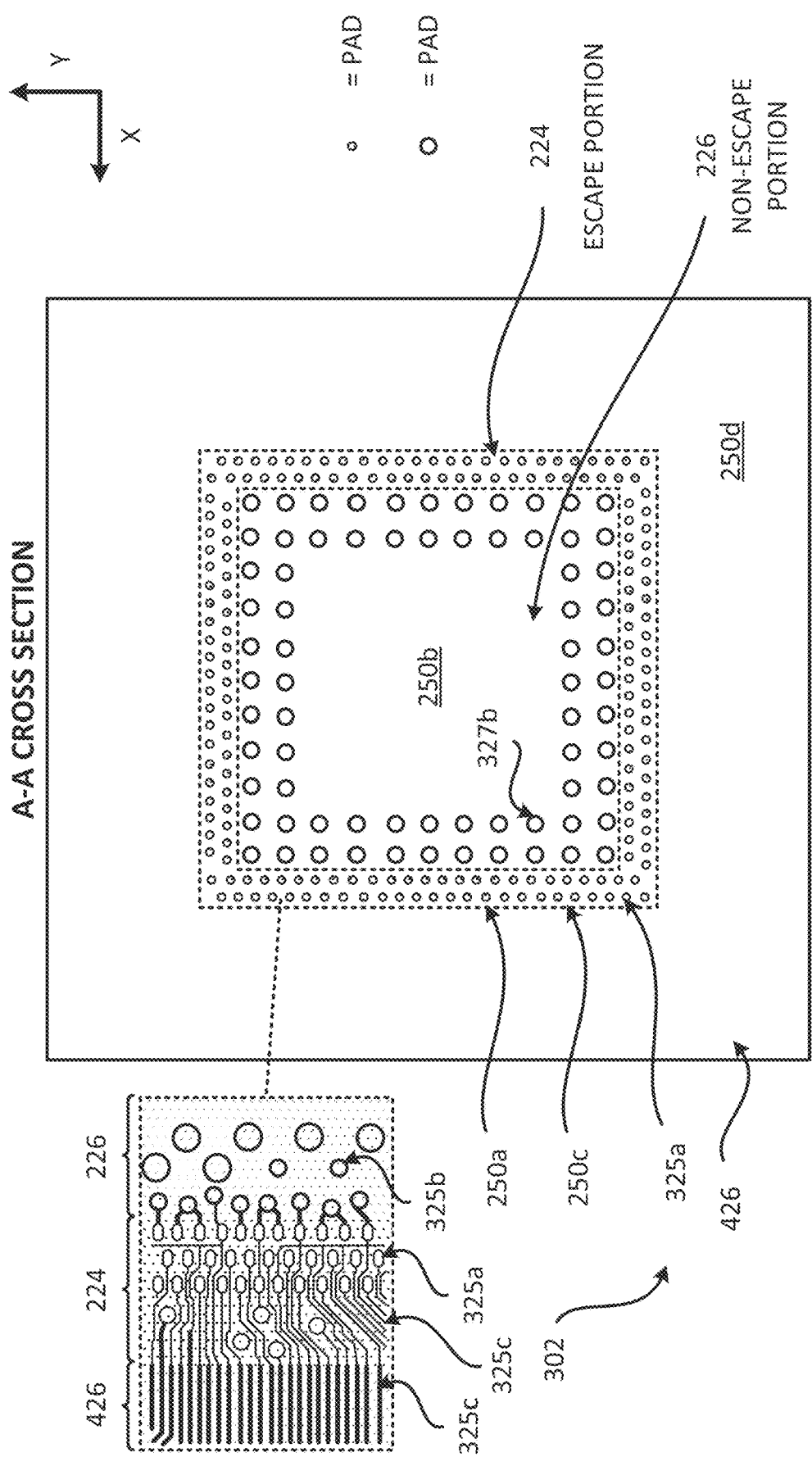
FIG. 4 illustrates a plan view of a substrate that includes high-density interconnects and interconnects embedded in a solder resist layer of the substrate.

FIG. 4 illustrates a plan view of the AA cross section of the substrate 302. As shown in FIG. 4, the substrate 302 includes a solder resist layer 250 that includes the solder resist layer portion 250a, the solder resist layer portion 250b, the solder resist layer portion 250c, the solder resist layer portion 250d, the plurality of high-density interconnects 325a, the plurality of interconnects 325b, the plurality of high-density interconnects 325c and the plurality of interconnects 325d. The plurality of high-density interconnects 325a, the plurality of high-density interconnects 325c, the solder resist layer portion 250a and the solder resist layer portion 250c are located in the escape portion 224 of the substrate 302. The escape portion 224 of the substrate 302 may be defined as a portion that is configured to be located above or below a portion (e.g., near periphery portion) of an integrated device coupled to the substrate 302. The plurality of interconnects 325b and the solder resist layer portion 250b are located in the non-escape portion 226 of the substrate 302. The non-escape portion 226 may be configured to be located above or below an integrated device coupled to the substrate 302. The escape portion 224 may laterally surround the non-escape portion 226. The integrated device 204, when coupled to the substrate 302, may vertically overlap with the escape portion 224 and the non-escape portion 226 of the substrate 302. The substrate 302 may also include a portion 426. The portion 426 may include the plurality of interconnects 325d and the solder resist layer portion 250d. The portion 426 is a portion of the substrate that does not vertically overlap with the integrated device 204. The escape portion 224 may be located between the portion 426 and the non-escape portion 226. The portion 426 includes interconnects that have higher minimum width and/or higher minimum spacing than the minimum width and/or minimum spacing of the interconnects of the escape portion 224. The portion 426 includes interconnects that have minimum width and/or minimum spacing that is equal and/or higher than the minimum width and/or minimum spacing of interconnects of the non-escape portion 226.

Figure 5:
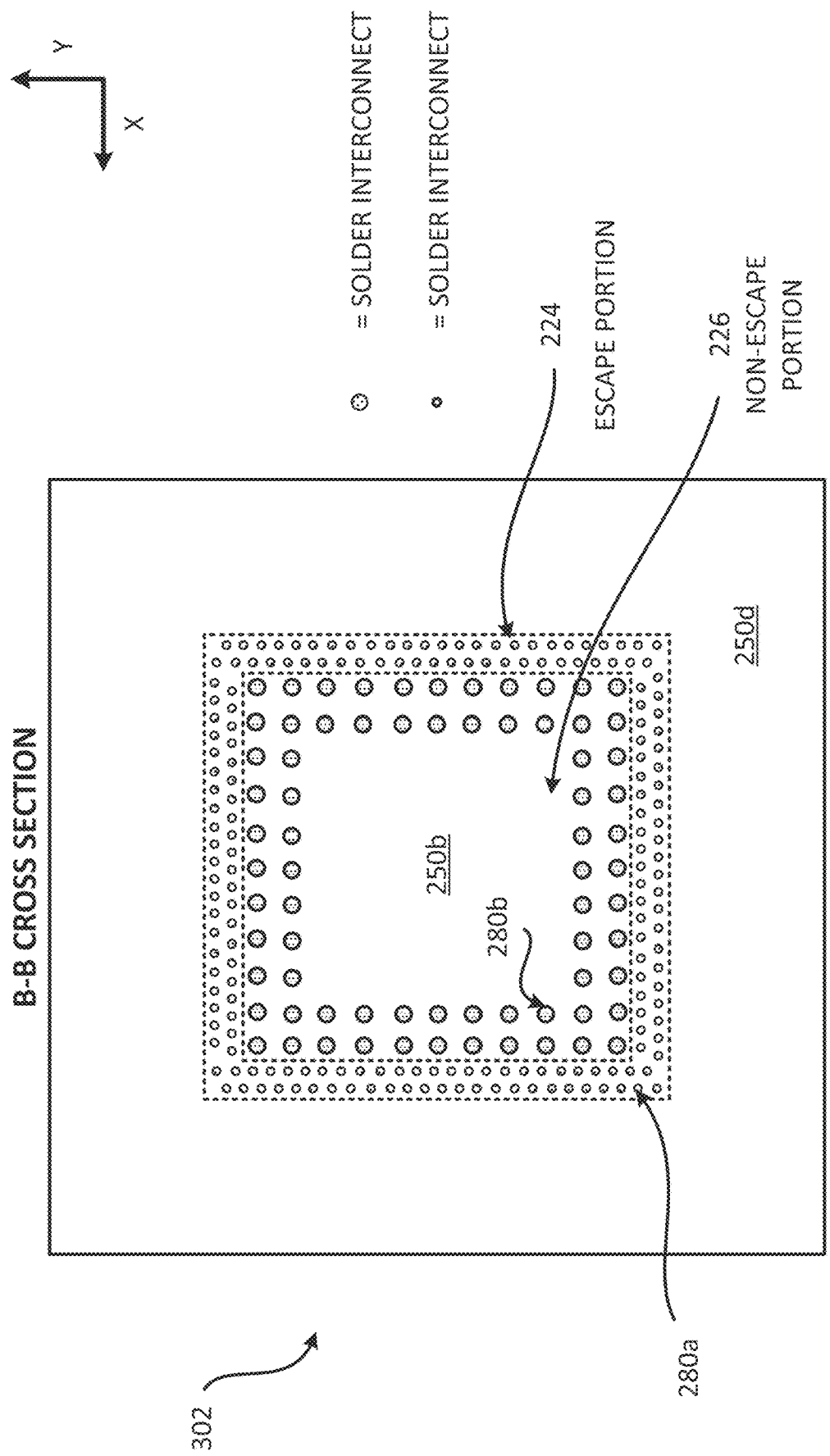
FIG. 5 illustrates a plan view of a substrate that includes high-density interconnects and interconnects embedded in a solder resist layer of the substrate.

FIG. 5 illustrates a plan view of the BB cross section of the substrate 302. As shown in FIG. 5, the substrate 302 includes a solder resist layer 250 that includes the solder resist layer portion 250a, the solder resist layer portion 250b, the solder resist layer portion 250c, the solder resist layer portion 250d, a plurality of solder interconnects 280a, and a plurality of solder interconnects 280b. The plurality of solder interconnects 280a may be coupled to the plurality of high-density interconnects 325a. The plurality of solder interconnects 280a may be located in a void of the solder resist layer 250. A void may be at least one region that is free of a solid material. A void may include a cavity. A void may be occupied by a gas (e.g., air). The plurality of solder interconnects 280b may be coupled to the plurality of interconnects 325b. The combination of FIGS. 4 and 5 illustrates how an integrated device may be configured to be electrically coupled to the pillar interconnects 290 and solder interconnects 280 through the escape portion 224. It is noted that the FIGS. 4 and 5 is not limited to being applicable to FIG. 3. FIGS. 4 and 5 may also be applicable to FIG. 6. That is, the planar cross sections shown in FIGS. 4 and 5 may also be applicable to the substrate of FIG. 6 described below.

Figure 6:
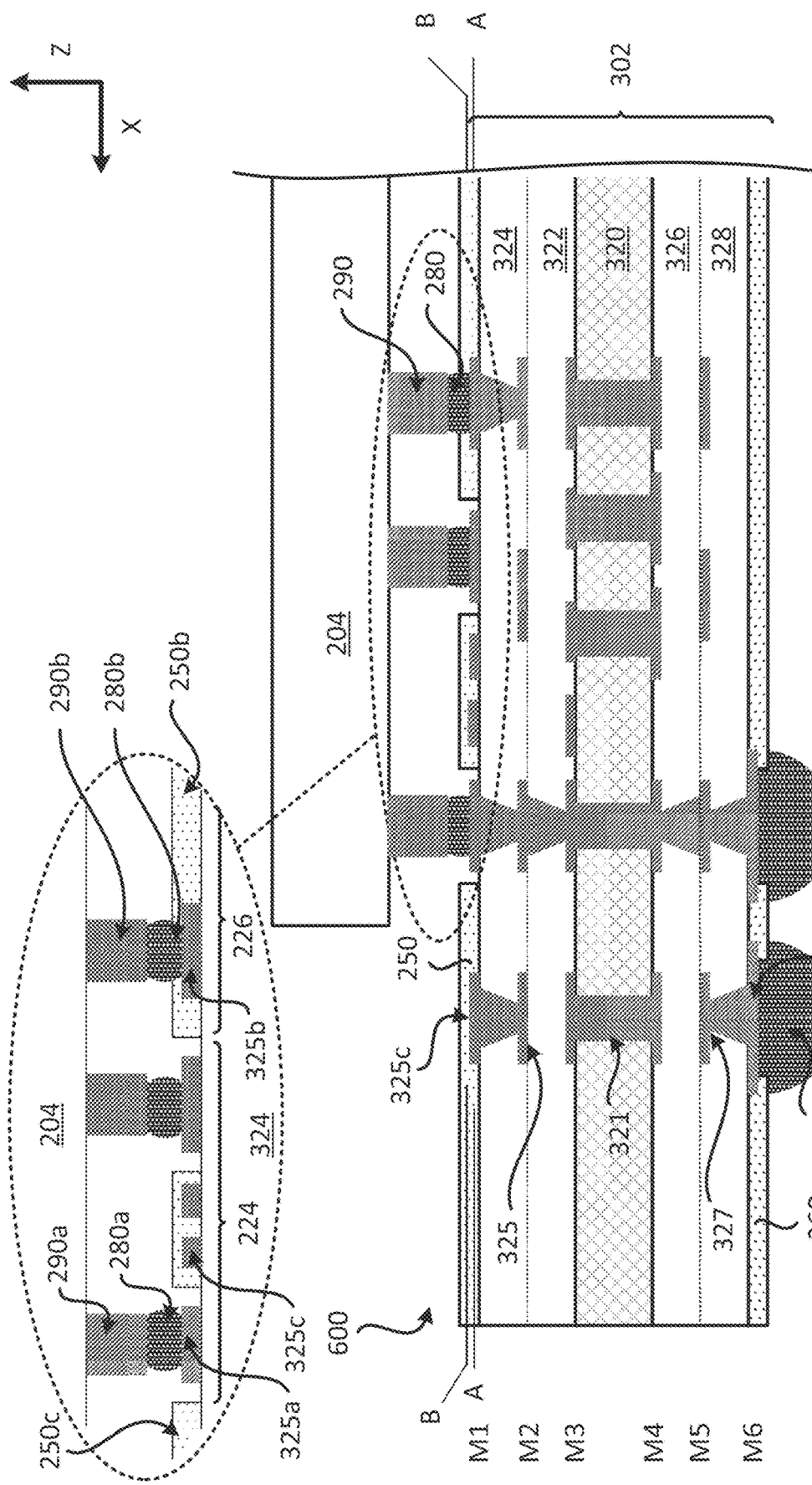
FIG. 6 illustrates a profile view of a package that includes a substrate and an integrated device coupled to high-density interconnects and interconnects that are embedded in a solder resist layer of the substrate.

FIG. 6 illustrates a profile view of a package 600 that includes a substrate comprising high-density interconnects embedded in a solder resist layer. The package 600 is similar to the package 300 of FIG. 3 and thus includes the same or similar components as described for the package 300. The package 600 includes a substrate 602 and the integrated device 204. The substrate 602 is similar to the substrate 302, and thus includes similar components as described for the substrate 302. The substrate 602 includes a plurality of high-density interconnects 325a that are partially embedded in a solder resist layer 250. The substrate 602 includes the plurality of high-density interconnects 325a that is not directly touching a solder resist layer (e.g., 250). For example, the top surface and the side surface of the plurality of high-density interconnects 325a are not covered by a solder resist layer.

In some implementations, the plurality of high-density interconnects (e.g., 325a) may have a surface roughness that is lower than a surface roughness of the plurality of interconnects (e.g., 325b). In some implementations, the plurality of interconnects (e.g., 325b) may have a surface roughness that is greater than a surface roughness of the plurality of high-density interconnects (e.g., 325a). For example, the plurality of high-density interconnects (e.g., 325a) may include a surface roughness in a range of approximately 0.2-0.5 micrometers, and the plurality of interconnects (e.g., 325b) may include a surface roughness in a range of approximately 0.6-0.8 micrometers. The difference in surface roughness may be due to the sand blasting that is performed on portions of the substrate.

The term "high-density interconnect(s)" may mean that the interconnect(s) has/have a lower minimum line (e.g., width), minimum spacing and/or minimum pitch, than the minimum line (e.g., width), minimum spacing and/or minimum pitch of interconnects (e.g., core interconnects) in other parts of the substrate. The plurality of high-density interconnects (e.g., 222a, 325a) may be a means for high-density interconnection. The plurality of interconnects (e.g., 222b, 325b) may be a means for interconnection.

An integrated device (e.g., 204) may include a die (e.g., semiconductor bare die). The integrated device may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon (Si) based integrated device, a silicon carbide (SiC) based integrated device, processor, memory and/or combinations thereof. An integrated device (e.g., 204) may include at least one electronic circuit (e.g., first electronic circuit, second electronic circuit, etc. . . . ).

The package (e.g., 200, 300, 600) may be implemented in a radio frequency (RF) package. The RF package may be a radio frequency front end package (RFFE). A package (e.g., 200, 300, 600) may be configured to provide Wireless Fidelity (WiFi) communication and/or cellular communication (e.g., 2G, 3G, 4G, 5G). The packages (e.g., 200, 300, 600) may be configured to support Global System for Mobile Communications (GSM), Universal Mobile Telecommunications System (UMTS), and/or Long-Term Evolution (LTE). The packages (e.g., 200, 300, 600) may be configured to transmit and receive signals having different frequencies and/or communication protocols.

Having described various substrates comprising various high-density interconnects, a sequence for fabricating a substrate that includes high-density interconnects embedded in a solder resist layer will now be described below. As shown below, the substrates described in the disclosure provides a low-cost substrate, a high reliability substrate with a low short risk in the escape area. Moreover, the substrate may be fabricated using a shorter fabrication process.

Exemplary Sequence for Fabricating a Substrate Comprising High-Density Interconnects Embedded in a Solder Resist Layer FIGS. 7A-7E illustrate an exemplary sequence for providing or fabricating a substrate that includes high-density interconnects embedded in a solder resist layer. In some implementations, the sequence of FIGS. 7A-7E may be used to provide or fabricate the substrate 302 of FIG. 3, or any of the substrates (e.g., 202, 602) described in the disclosure.

It should be noted that the sequence of FIGS. 7A-7E may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 7A:
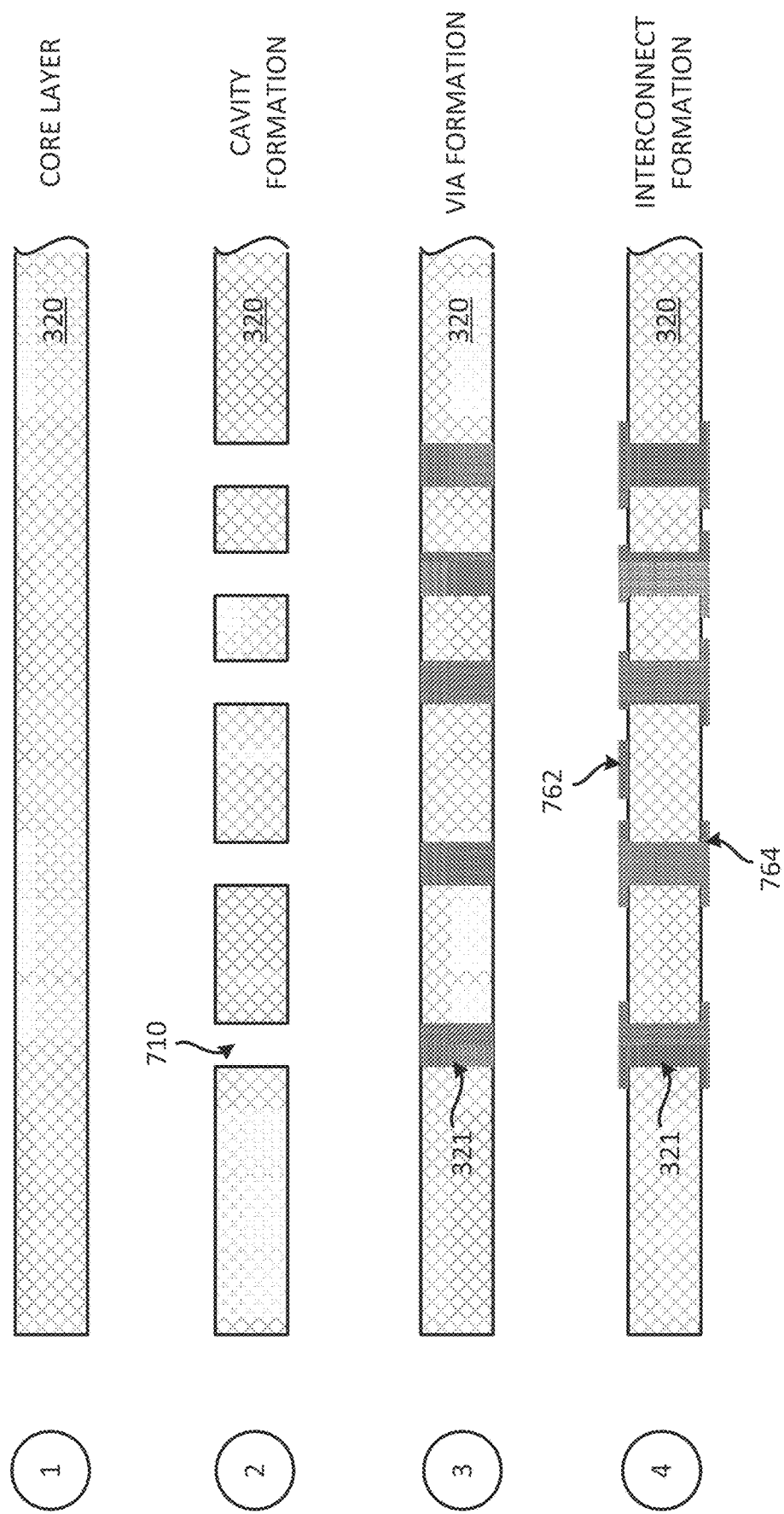

Stage 1, as shown in FIG. 7A, illustrates a state after a core layer 320 is provided. The core layer 320 may include glass or glass fiber with resin. However, the core layer 320 may include different materials. The core layer 320 may have different thicknesses.

Stage 2 illustrates a state after a plurality of cavities 710 is formed in the core layer 320. The plurality of cavities 710 may be formed through a laser process and/or a drilling process. The plurality of cavities 710 may travel through the core layer 320.

Stage 3 illustrates a state after a plurality of core interconnects are formed in the plurality of cavities 710. For example, a first plurality of core interconnects 321 may be formed in the plurality of cavities 710. A plating process may be used to form the first plurality of core interconnects 321. However, different implementations may use different processes for forming the first plurality of core interconnects 321. The first plurality of core interconnects 321 may include core vias located in the core layer 320.

Stage 4 illustrates a state after a plurality of interconnects 762 is formed over the first surface (e.g., top surface) of the core layer 320. The plurality of interconnects 762 may be coupled to the first plurality of core interconnects 321. Stage 4 also illustrates a state after a plurality of interconnects 764 is formed over the second surface (e.g., bottom surface) of the core layer 320. The plurality of interconnects 764 may be coupled to the first plurality of core interconnects 321. A patterning process, a stripping process and/or a plating process may be used to form the plurality of interconnects 762 and the plurality of interconnects 764.

Figure 7B:
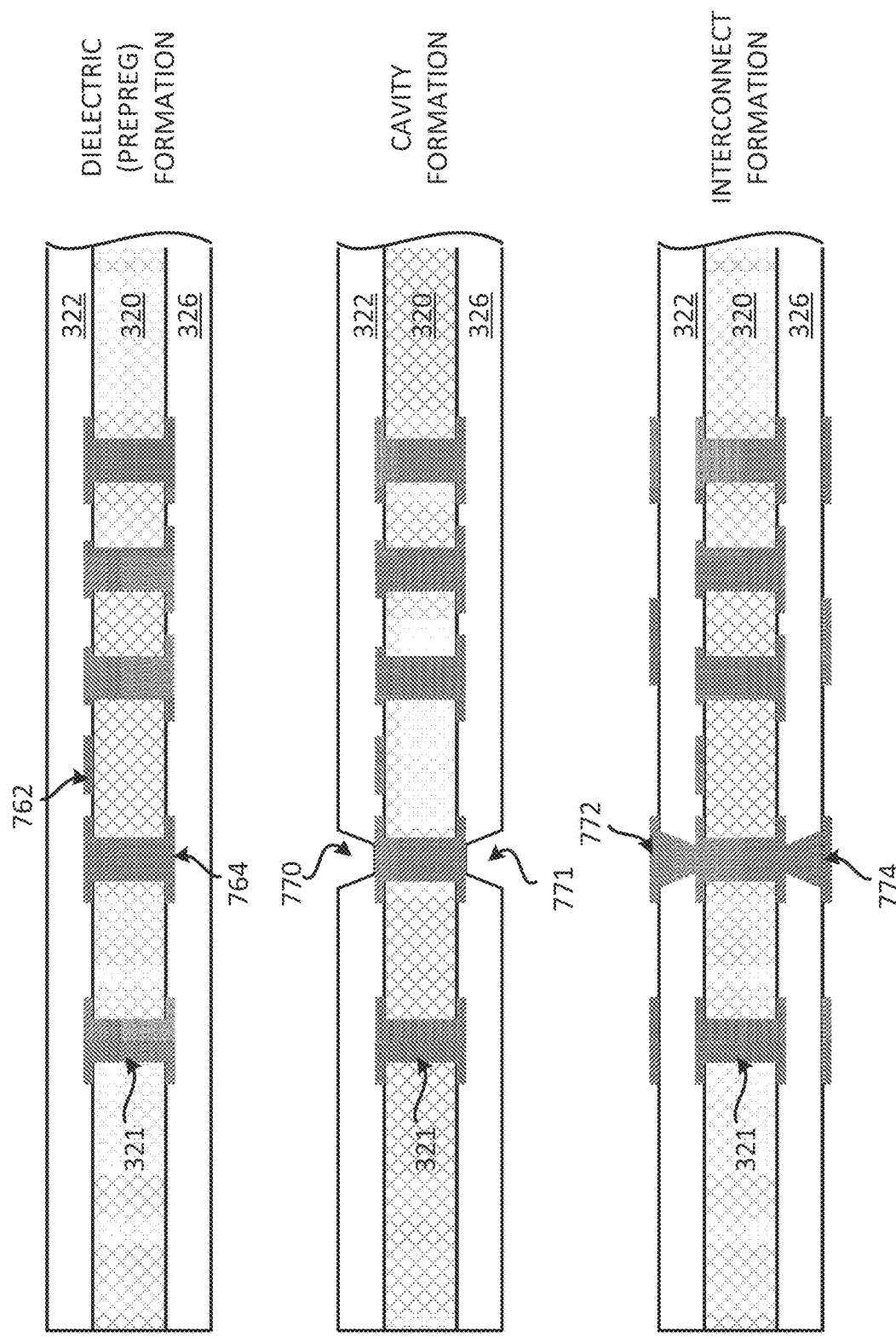

Stage 5, as shown in FIG. 7B, illustrates a state after a dielectric layer 322 is formed over the first surface of the core layer 320, and a dielectric layer 326 is formed over the second surface of the core layer 320. A deposition process and/or lamination process may be used to form dielectric layers 322 and 326. The dielectric layers 322 and 326 may include prepreg (e.g., prepreg layers).

Stage 6 illustrates a state after a plurality of cavities 770 is formed in the dielectric layer 322, and a plurality of cavities 771 is formed in the dielectric layer 326. A laser process (e.g., laser drilling, laser ablation) may be used to form the plurality of cavities 770 and the plurality of cavities 771.

Stage 7 illustrates a state after a plurality of interconnects 772 is formed over and coupled to the dielectric layer 322 and the plurality of cavities 770. The plurality of interconnects 772 may be coupled to the plurality of interconnects 762. Stage 7 also illustrates a state after a plurality of interconnects 774 is formed over and coupled the dielectric layer 326 and the plurality of cavities 771. The plurality of interconnects 774 may be coupled to the plurality of interconnects 764. A patterning process, a stripping process and/or a plating process may be used to form the plurality of interconnects 772 and the plurality of interconnects 774.

Figure 7C:
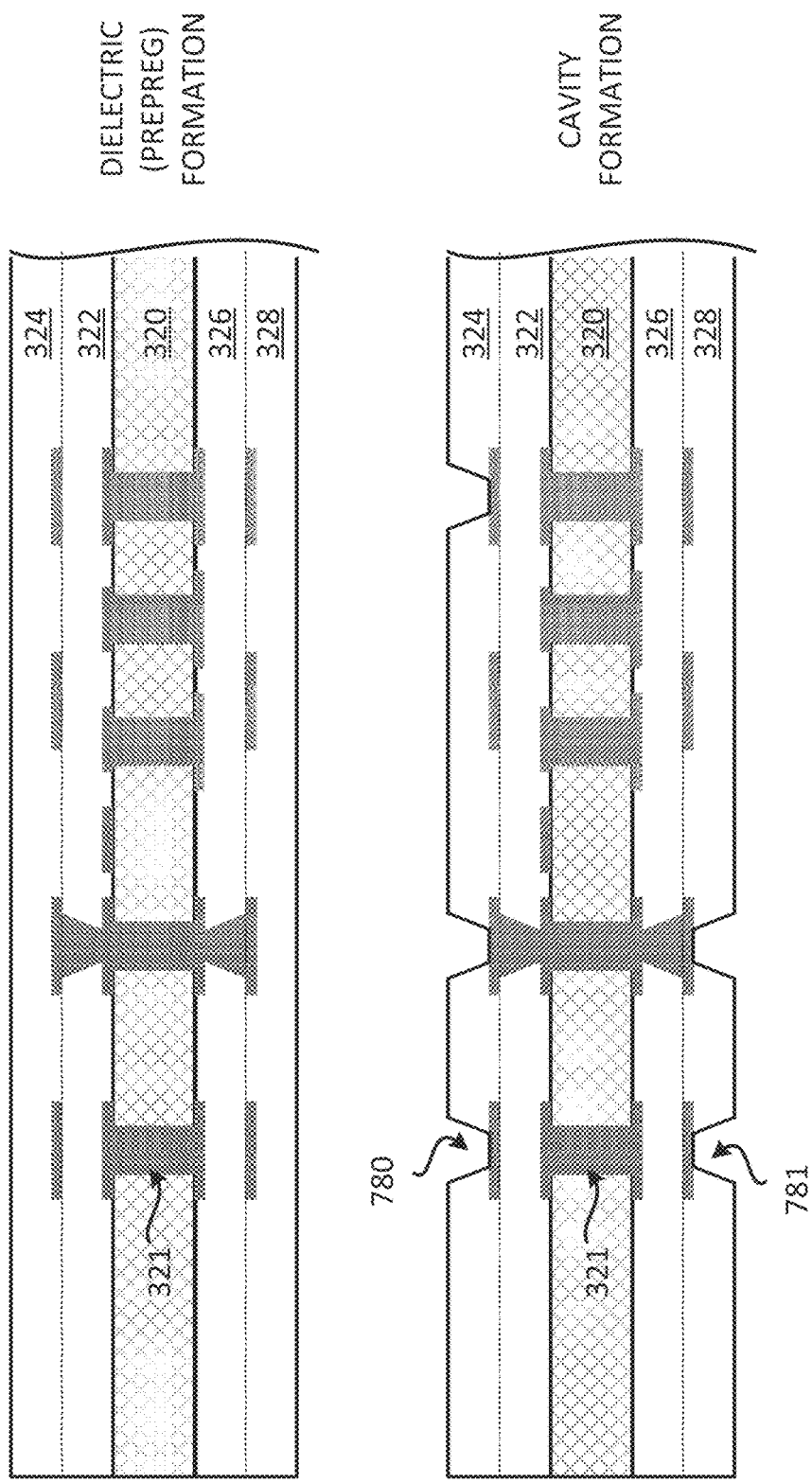

Stage 8, as shown in FIG. 7C, illustrates a state after a dielectric layer 324 is formed over and coupled to a first surface of dielectric layer 322, and a dielectric layer 328 is formed over and coupled to a second surface of the dielectric layer 326. A deposition process and/or lamination process may be used to form dielectric layers 324 and 328. The dielectric layers 324 and 328 may include prepreg (e.g., prepreg layers).

Stage 9 illustrates a state after a plurality of cavities 780 is formed in the dielectric layer 324, and a plurality of cavities 781 is formed in the dielectric layer 328. A laser process (e.g., laser drilling, laser ablation) may be used to form the plurality of cavities 780 and the plurality of cavities 781.

Figure 7D:
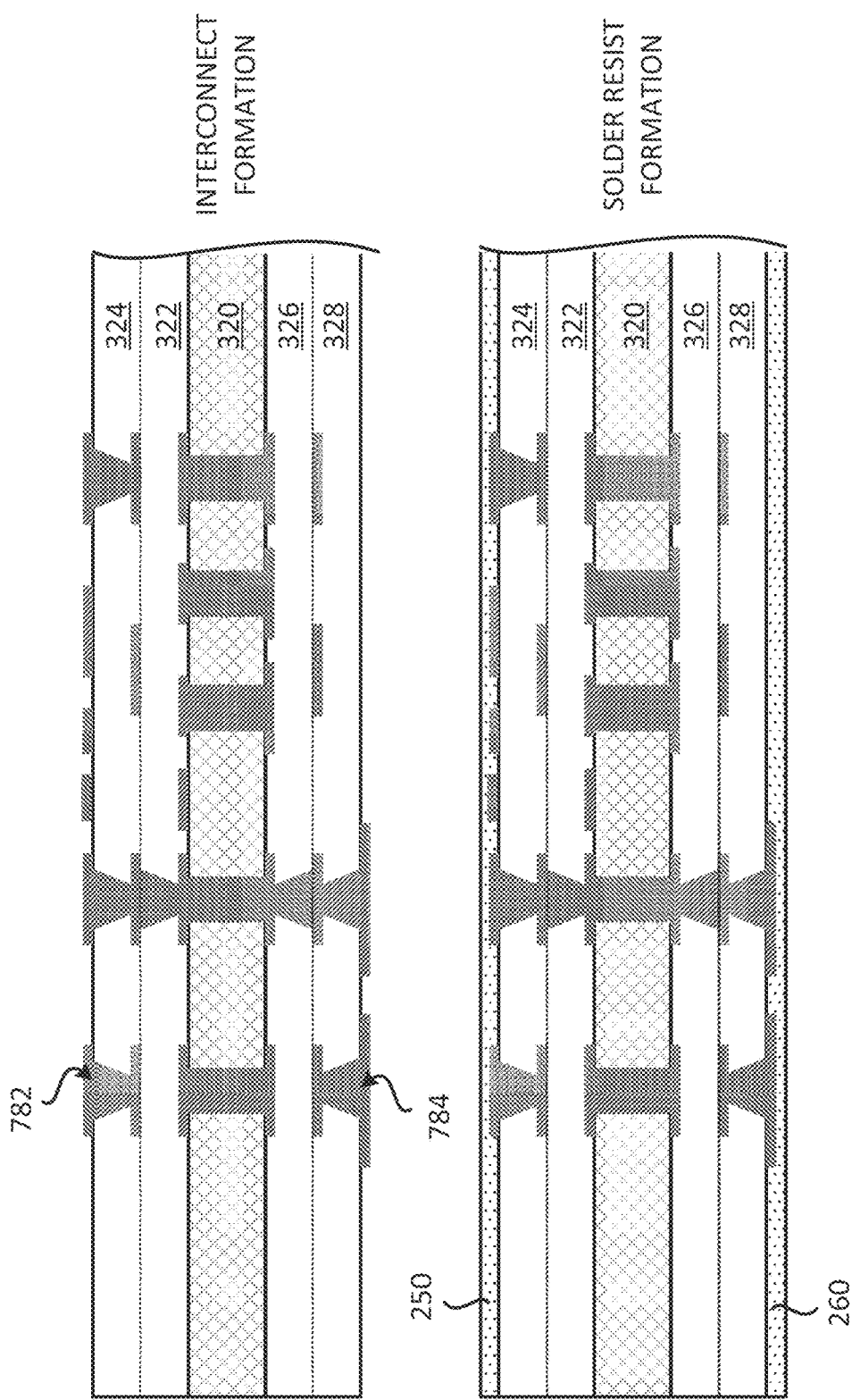

Stage 10, as shown in FIG. 7D, illustrates a state after a plurality of interconnects 782 is formed over and coupled to the dielectric layer 324 and the plurality of cavities 780. The plurality of interconnects 782 may be coupled to the plurality of interconnects 772. Stage 10 also illustrates a state after a plurality of interconnects 784 is formed over and coupled to the dielectric layer 328 and the plurality of cavities 781. The plurality of interconnects 784 may be coupled to the plurality of interconnects 774. A patterning process, a stripping process and/or a plating process may be used to form the plurality of interconnects 782 and the plurality of interconnects 784. It is noted that additional dielectric layers and additional interconnects may be formed by repeating Stages 8-10 of FIGS. 7C-7D, as described above. The plurality of interconnects 782 may represent the plurality of interconnects 325.

Stage 11 illustrates a state after (i) the solder resist layer 250 is formed over the dielectric layer 324 and the plurality of interconnects 782, and (ii) the solder resist layer 260 is formed over the dielectric layer 328 and the plurality of interconnects 784. A deposition process may be used the solder resist layer 250 and the solder resist layer 260.

Stage 12, as shown in FIG. 7E, illustrates a state after a dry film 720 is formed over the solder resist layer 250, covering part of the solder resist layer 250 and exposing part of the solder resist layer 250.

Stage 13 illustrates a state after exposed portions of the solder resist layer 250 has been partially removed. For example, as shown in Stage 13, portions of the solder resist layer 250 may be removed such that the thickness of the remaining solder resist layer 250 is less than the thickness of high-density interconnects 325a. In some implementations, some portions of the solder resist layer 250 may have a lower thickness than the thickness of the plurality of high-density interconnects 325a. A sand blasting process may be used to remove portions of the solder resist layer 250. Removing portions of the solder resist layer 250 may include thinning portions and/or removing portions of the solder resist layer 250 in the escape portion 224 of the substrate 302. One effect of the sand blasting process is that the surface of the plurality of high-density interconnects 325a has a lower surface roughness than the surface of the of the plurality of interconnects 325b. Stage 13 may illustrate the substrate 302 that includes a plurality of high-density interconnects 325a, a plurality of high-density interconnects 325c, and a plurality of interconnects 325b.

Figure 8:
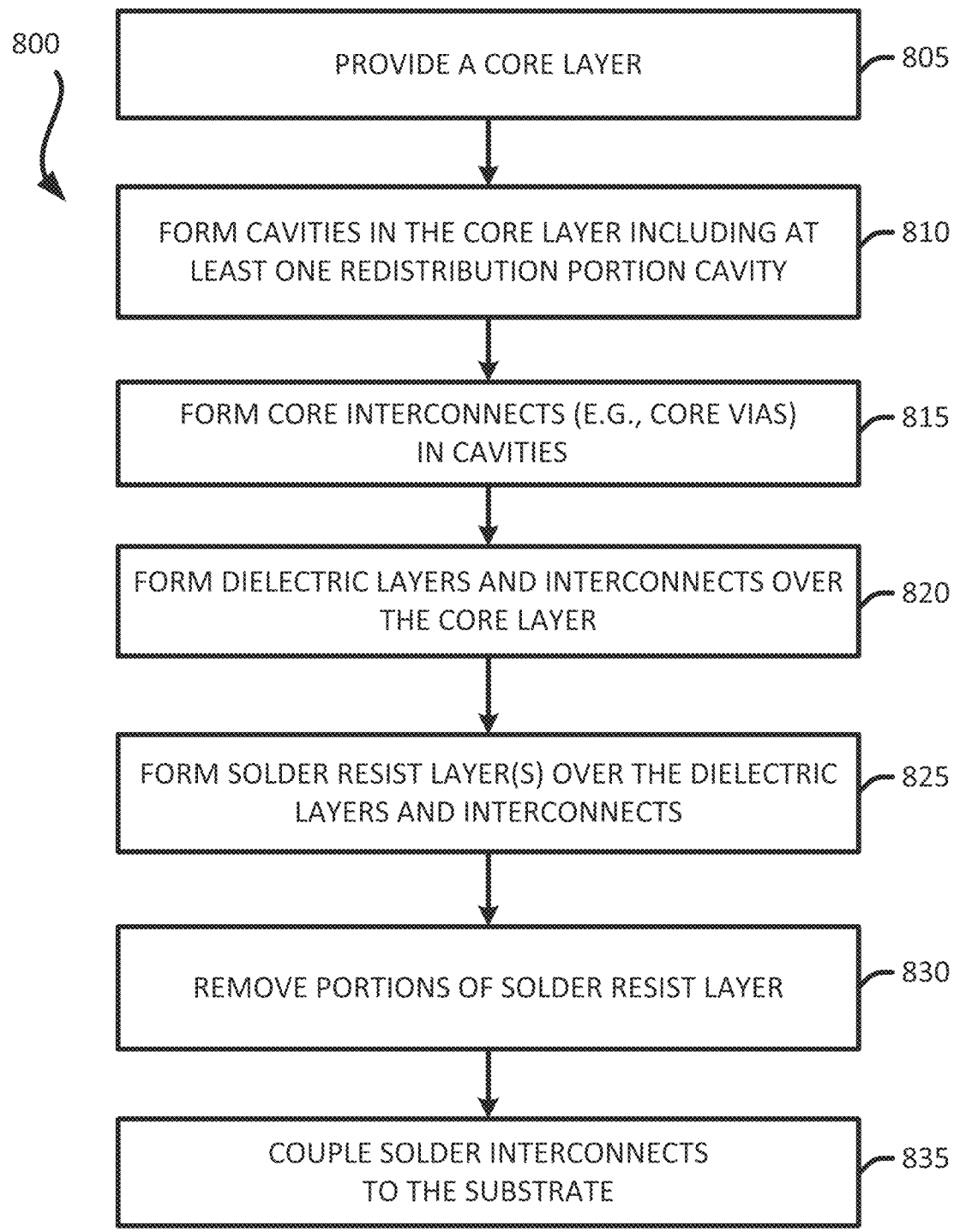
FIG. 8 illustrates an exemplary flow diagram of a method for fabricating a substrate that includes a high-density interconnect embedded in a solder resist layer.

Exemplary Flow Diagram of a Method for Fabricating a Substrate Comprising High-Density Interconnects Embedded in a Solder Resist Layer In some implementations, fabricating a substrate includes several processes. FIG. 8 illustrates an exemplary flow diagram of a method 800 for providing or fabricating a substrate. In some implementations, the method 800 of FIG. 8 may be used to provide or fabricate the substrate of FIG. 3. For example, the method of FIG. 8 may be used to fabricate the substrate 302. However, the method of FIG. 8 may be used fabricate any substrate in the disclosure, such as for example, the substrates of FIGS. 2 and 6.

It should be noted that the method of FIG. 8 may combine one or more processes in order to simplify and/or clarify the method for providing or fabricating a substrate. In some implementations, the order of the processes may be changed or modified.

The method provides (at 805) a core layer (e.g., 320). The core layer 320 may include glass or glass fiber with resin. However, the core layer 320 may include different materials. The core layer 320 may have different thicknesses. Stage 1 of FIG. 7A illustrates and describes an example of a core layer that is provided.

The method forms (at 810) a plurality of cavities (e.g., 710) in the core layer. A laser process or a drilling process may be used to form the cavities. The plurality of cavities may travel through the core layer 320. Stage 2 of FIG. 7A illustrates and describes examples of forming cavities in the core layer.

The method forms (at 815) a plurality of core interconnects (e.g., 321) in the plurality of cavities (e.g., 710). For example, a first plurality of core interconnects 321 may be formed in the plurality of cavities 710. A plating process may be used to form the first plurality of core interconnects 321. However, different implementations may use different processes for forming the first plurality of core interconnects 321. The first plurality of core interconnects 321 may include core vias located in the core layer 320. Stage 3 of FIG. 7A illustrates and describes an example of core interconnects located in the core layer.

The method forms (at 820) a plurality of interconnects (e.g., 325, 327) and at least one dielectric layer (e.g., 322, 324) over a first surface of the core layer and a second surface of the core layer (e.g., 320). A patterning process, a stripping process and/or a plating process may be used to form the plurality of interconnects. A laser process (e.g., laser drilling, laser ablation) may be used to form the plurality of cavities in a dielectric layer. A deposition process and/or a lamination process may be used to form at least one dielectric layer. The at least one dielectric layer may include prepreg (e.g., prepreg layer). Stages 5-10 of FIGS. 7B-7D illustrate and describe examples of forming a plurality of interconnects and at least one dielectric layer (e.g., prepreg).

The method forms (at 825) at least one solder resist layer (e.g., 250) over a first surface of a dielectric layer, and at least one solder resist layer (e.g., 260) over a second surface of a dielectric layer. A deposition process may be used to form the solder resist layer 250 and the solder resist layer 260. Stage 11 of FIG. 7D illustrates and describes an example of forming solder resist layers over dielectric layers.

The method removes (at 830) portions of the solder resist layer (e.g., 250). Removing portions of the solder resist layer may include thinning portions of the solder resist layer. In some implementations, some portions of the solder resist layer 250 may have a lower thickness than the thickness of the plurality of high-density interconnects 325a. In some implementations, some portions of the solder resist layer 250 may have a thickness that is equal to the thickness of the plurality of high-density interconnects 325a. Different implementations may use different processes for removing portions of the solder resist layer. A sand blasting process may be used to remove portions of the solder resist layer 250. Removing portions of the solder resist layer 250 may include thinning portions of the solder resist layer 250 in the escape portion 224 of the substrate 302. Removing portions of the solder resist layer may include applying a dry film and performing sand blasting on portions of the solder resist layer that is exposed (e.g., free of the dry film). Once the sand blasting is done, the dry film may be removed. One effect of the sand blasting process is that the surface of the plurality of high-density interconnects 327a has a lower surface roughness than the surface of the of the plurality of interconnects 327b. Stages 12-13 of FIG. 7E illustrate and describe an example of removing portions of a solder resist layer.

The method may couple (at 835) a plurality of solder interconnects (e.g., 270) to the substrate (e.g., 202, 302, 602). For example, a reflow solder process may be used to couple the plurality of solder interconnects 270 to the plurality of interconnects 327 of the substrate 202.

Figure 9:
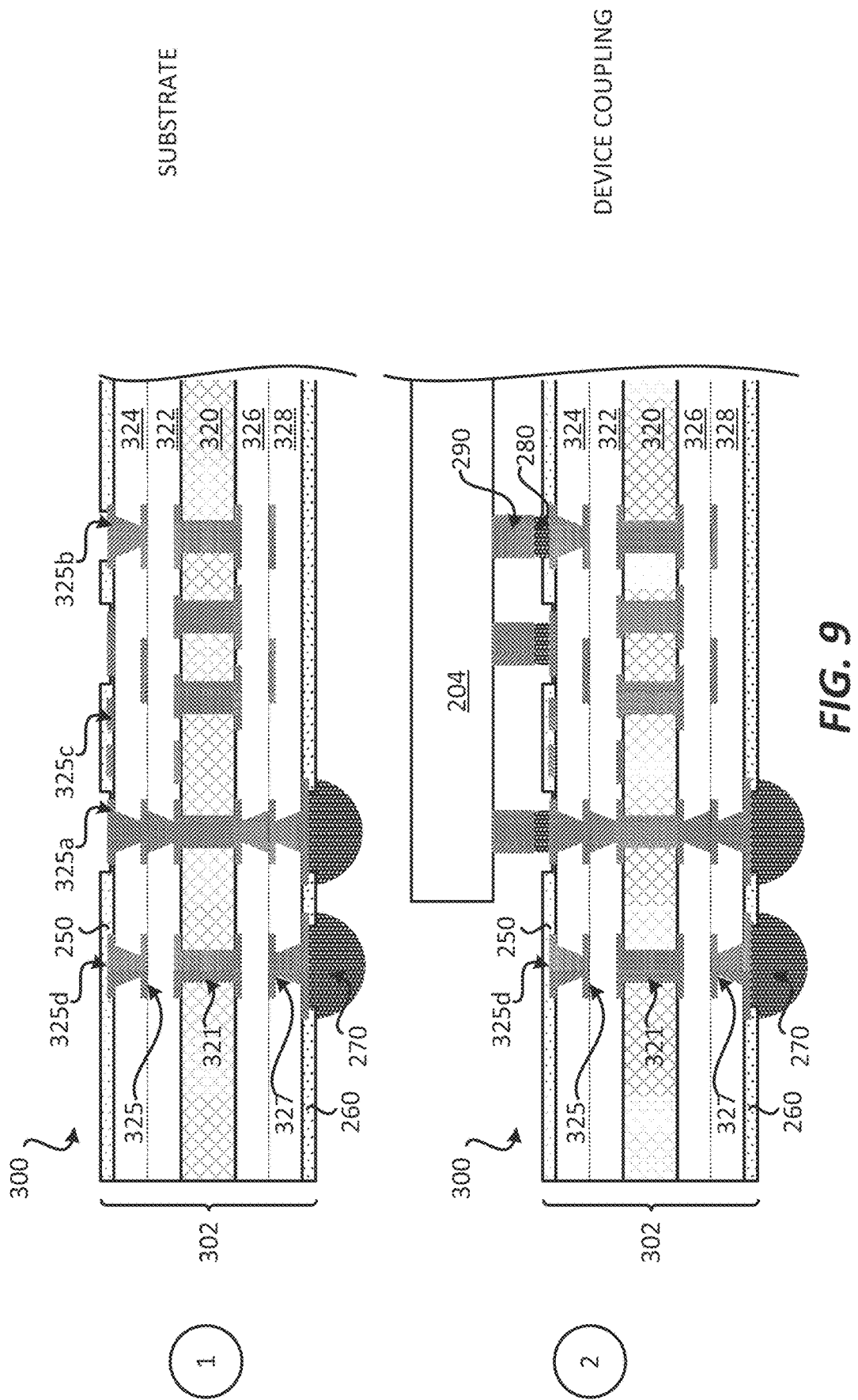
FIG. 9 illustrates an exemplary sequence for fabricating a package that includes an integrated device and a substrate that includes a high-density interconnect embedded in a solder resist layer.

Exemplary Sequence for Fabricating a Package that Includes a Substrate Comprising High-Density Interconnects Embedded in a Solder Resist Layer FIG. 9 illustrates an exemplary sequence for providing or fabricating a package that includes a substrate comprising high-density interconnects embedded in a solder resist layer. In some implementations, the sequence of FIG. 9 may be used to provide or fabricate the package 600 of FIG. 6, or any of the packages described in the disclosure.

It should be noted that the sequence of FIG. 9 may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure. Different implementations may fabricate a package differently.

Stage 1, as shown in FIG. 9A, illustrates a state after a substrate 602 is provided. The substrate 602 may be provided using the process described in FIG. 7A-7E. The substrate 602 includes interconnects located (e.g., embedded) in a solder resist layer. For example, the substrate 602 may include a plurality of high-density interconnects 325a, a plurality of high-density interconnects 325c, a plurality of interconnects 325b and the solder resist layer 250.

Stage 2 illustrates a state after an integrated device 204 is coupled to the substrate 602 through the plurality of pillar interconnects 290 and/or the plurality of solder interconnects 280. A pick and place process may be used to place the integrated device 204 over a first surface of the substrate 602. A solder reflow process may be used to couple the integrated device 204 to the substrate 602. The integrated device 204 may be located over a non-escape portion 226 and an escape portion 224 of the substrate 604, as described above in FIGS. 3 and 6.

Exemplary Electronic Devices

Figure 10:
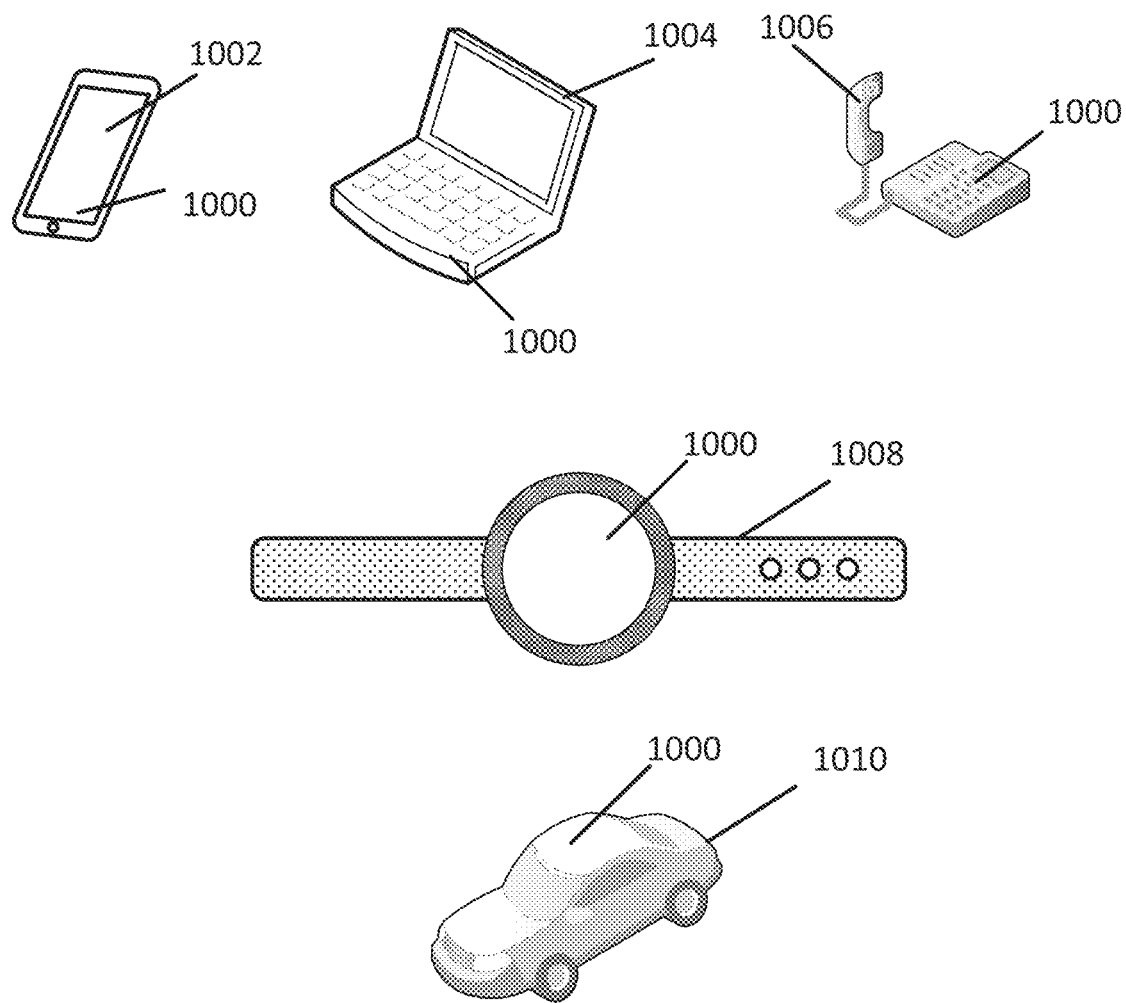
FIG. 10 illustrates various electronic devices that may integrate a die, an electronic circuit, an integrated device, an integrated passive device (IPD), a passive component, a package, and/or a device package described herein.

FIG. 10 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-6, 7A-7E, and/or 9-10 may be rearranged and/or combined into a single component, process, feature or function or embodied in several components, processes, or functions. Additional elements, components, processes, and/or functions may also be added without departing from the disclosure. It should also be noted FIGS. 2-6, 7A-7E, and/or 9-10 and its corresponding description in the present disclosure is not limited to dies and/or ICs. In some implementations, FIGS. 2-6, 7A-7E, and/or 9-10 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A substrate comprising:
a core layer comprising a first surface and a second surface;
at least one first dielectric layer coupled to the first surface of the core layer;
at least one second dielectric layer coupled to the second surface of the core layer;
a plurality of first interconnects located over a surface of the at least one first dielectric layer, wherein the plurality of first interconnects includes a first surface roughness;
a plurality of second interconnects located over the surface of the at least one first dielectric layer, wherein the plurality of second interconnects includes a second surface roughness that is greater than the first surface roughness; and
a plurality of third interconnects located over the surface of the at least one first dielectric layer,
wherein the plurality of third interconnects is coupled to the plurality of first interconnects, and
wherein the plurality of third interconnects and the plurality of second interconnects are co-planar to the plurality of first interconnects; and
a solder resist layer located over the surface of the at least one first dielectric layer, the solder resist layer comprising a first portion, a second portion, and a third portion,
wherein the first portion of the solder resist layer that is touching the plurality of first interconnects includes a first thickness that is less than a thickness of the plurality of first interconnects,
wherein the second portion of the solder resist layer that is touching the plurality of second interconnects includes a second thickness that is greater than a thickness of the plurality of second interconnects, and
wherein the third portion of the solder resist layer is located over a top surface and a side surface of each of the third interconnects of the plurality of third interconnects.

2. The substrate of claim 1,
wherein the plurality of first interconnects includes a plurality of pad interconnects, and
wherein the plurality of third interconnects includes a plurality of traces interconnects.

3. The substrate of claim 1,
wherein the plurality of first interconnects includes interconnects with (i) a minimum width of 8 micrometers and (ii) a minimum spacing of 10 micrometers,
wherein the plurality of second interconnects includes interconnects with (i) a minimum width of 20 micrometers and (ii) a minimum spacing of 25 micrometers, and
wherein the plurality of third interconnects includes interconnects with (i) a minimum width of 8 micrometers and (ii) a minimum spacing of 10 micrometers.

4. The substrate of claim 1, wherein the plurality of first interconnects and the plurality of third interconnects are located in an integrated device escape portion of the substrate.

5. The substrate of claim 1,
wherein the first surface roughness is in a range of about 0.2-0.5 micrometers, and
wherein the second surface roughness is in a range of about 0.6-0.8 micrometers.

6. The substrate of claim 1, wherein a side surface of the plurality of first interconnects is free of the solder resist layer.

7. The substrate of claim 1, wherein a portion of a side surface of the plurality of first interconnects is free of the solder resist layer.

8. The substrate of claim 1, wherein the plurality of third interconnects is completely covered by the solder resist layer.

9. The substrate of claim 1, wherein the plurality of first interconnects, the plurality of second interconnects and the plurality of third interconnects are located on a same metal layer of the substrate.

10. A device comprising:
an integrated device; and
a substrate coupled to the integrated device, the substrate comprising:
a core layer comprising a first surface and a second surface;
at least one first dielectric layer coupled to the first surface of the core layer;
at least one second dielectric layer coupled to the second surface of the core layer;
a plurality of first interconnects located over a surface of the at least one first dielectric layer;
a plurality of second interconnects located over the surface of the at least one first dielectric layer; and
a plurality of third interconnects located over the surface of the at least one first dielectric layer,
wherein the plurality of third interconnects is coupled to the plurality of first interconnects, and
wherein the plurality of third interconnects and the plurality of second interconnects are co-planar to the plurality of first interconnects,
wherein the plurality of first interconnects includes interconnects with (i) a minimum width of 8 micrometers and (ii) a minimum spacing of 10 micrometers,
wherein the plurality of second interconnects includes interconnects with (i) a minimum width of 20 micrometers and (ii) a minimum spacing of 25 micrometers, and
wherein the plurality of third interconnects includes interconnects with (i) a minimum width of 8 micrometers and (ii) a minimum spacing of 10 micrometers; and
a solder resist layer located over the surface of the at least one first dielectric layer, the solder resist layer comprising a first portion, a second portion, and a third portion,
wherein the first portion of the solder resist layer that is touching the plurality of first interconnects includes a first thickness that is less than a thickness of the plurality of first interconnects,
wherein the second portion of the solder resist layer that is touching the plurality of second interconnects includes a second thickness that is greater than a thickness of the plurality of second interconnects, and
wherein the third portion of the solder resist layer is located over a top surface and a side surface of each of the third interconnects of the plurality of third interconnects.

11. The device of claim 10,
wherein the plurality of first interconnects includes a plurality of pad interconnects, and
wherein the plurality of third interconnects includes a plurality of traces interconnects.

12. The device of claim 10, wherein the plurality of first interconnects and the plurality of third interconnects are located in an integrated device escape portion of the substrate.

13. The device of claim 10,
wherein the plurality of first interconnects includes a first surface roughness, and
wherein the plurality of second interconnects includes a second surface roughness that is greater than the first surface roughness.

14. The device of claim 10, wherein a portion of a side surface of the plurality of first interconnects is free of the solder resist layer.

15. The device of claim 10, wherein the plurality of third interconnects is completely covered by the solder resist layer.

16. The device of claim 10, wherein the plurality of first interconnects, the plurality of second interconnects and the plurality of third interconnects are located on a same metal layer of the substrate.

17. The device of claim 10, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

18. A device comprising:
an integrated device; and
a substrate coupled to the integrated device, the substrate comprising:
a core layer comprising a first surface and a second surface;
at least one first dielectric layer coupled to the first surface of the core layer;
at least one second dielectric layer coupled to the second surface of the core layer;
a plurality of first interconnects located over a surface of the at least one first dielectric layer;
a plurality of second interconnects located over the surface of the at least one first dielectric layer; and
a plurality of third interconnects located over the surface of the at least one first dielectric layer,
wherein the plurality of third interconnects is coupled to the plurality of first interconnects, and
wherein the plurality of third interconnects and the plurality of second interconnects are co-planar to the plurality of first interconnects,
a solder resist layer located over the surface of the at least one first dielectric layer, the solder resist layer comprising a first portion, a second portion, and a third portion,
wherein the first portion of the solder resist layer that is touching the plurality of first interconnects includes a first thickness that is less than a thickness of the plurality of first interconnects,
wherein the second portion of the solder resist layer that is touching the plurality of second interconnects includes a second thickness that is greater than a thickness of the plurality of second interconnects,
wherein the third portion of the solder resist layer is located over a top surface and a side surface of each of the third interconnects of the plurality of third interconnects, and
wherein a portion of a side surface of the plurality of first interconnects is free of the solder resist layer.

19. The device of claim 18,
wherein the plurality of first interconnects includes a plurality of pad interconnects, and
wherein the plurality of third interconnects includes a plurality of traces interconnects.

20. The device of claim 18, wherein the plurality of first interconnects and the plurality of third interconnects are located in an integrated device escape portion of the substrate.

21. The device of claim 18,
wherein the plurality of first interconnects includes a first surface roughness, and
wherein the plurality of second interconnects includes a second surface roughness that is greater than the first surface roughness.

22. The device of claim 18, wherein the plurality of third interconnects is completely covered by the solder resist layer.

23. The device of claim 18, wherein the plurality of first interconnects, the plurality of second interconnects and the plurality of third interconnects are located on a same metal layer of the substrate.

24. The device of claim 18, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

* * * * *